(12) United States Patent
Liang et al.

(10) Patent No.: US 12,690,134 B2
(45) Date of Patent: Jul. 21, 2026

(54) PRINTED CIRCUIT BOARD THUMBSCREW LOCKING REINFORCEMENT STRUCTURE

(71) Applicant: AMD Design, LLC, Wilmington, DE (US)

(72) Inventors: David Liang, West Orange, NJ (US); Jeff Valerio, Secaucus, NJ (US)

(73) Assignee: AMD Design, LLC, Wilmington, DE (US)

( * ) Notice: Subject to any disclaimer, the term of this patent is extended or adjusted under 35 U.S.C. 154(b) by 1200 days.

(21) Appl. No.: 17/667,980

(22) Filed: Feb. 9, 2022

(65) Prior Publication Data

US 2023/0254974 A1 Aug. 10, 2023

(51) Int. Cl.
*H05K 1/181* (2026.01)
*H05K 7/14* (2006.01)

(52) U.S. Cl.
CPC ........... *H05K 1/181* (2013.01); *H05K 7/1417* (2013.01); *H05K 2201/10409* (2013.01)

(58) Field of Classification Search
CPC ................ H05K 1/181; H05K 7/1417; H05K 2201/10409; F16B 39/08; F16B 39/10
USPC ......................... 411/166, 109, 119–120, 315
See application file for complete search history.

(56) References Cited

U.S. PATENT DOCUMENTS

| | | | | |
|---|---|---|---|---|
| 1,030,146 A | * | 6/1912 | Wade | F16B 39/10 |
| | | | | 411/945 |
| 1,741,077 A | * | 12/1929 | Rusack | F16B 39/10 |
| | | | | 411/984 |
| 2,400,318 A | * | 5/1946 | Rosan | F16B 39/10 |
| | | | | 285/91 |
| 2,577,810 A | * | 12/1951 | Rosan | F16B 37/122 |
| | | | | 29/523 |
| 3,395,934 A | * | 8/1968 | Capistrano | F16L 13/16 |
| | | | | 285/23 |
| 3,464,474 A | * | 9/1969 | Jansen | F16B 39/04 |
| | | | | 411/946 |
| 4,534,101 A | * | 8/1985 | Rosan, Jr. | F16B 39/10 |
| | | | | 29/259 |
| 4,568,228 A | * | 2/1986 | Rosan, Jr. | F16B 39/10 |
| | | | | 411/968 |
| 4,826,374 A | * | 5/1989 | Baglin | F16B 37/044 |
| | | | | 411/103 |

(Continued)

*Primary Examiner* — Christine M Mills
*Assistant Examiner* — Dil K. Magar
(74) *Attorney, Agent, or Firm* — SCULLY, SCOTT, MURPHY & PRESSER, P.C.

(57) ABSTRACT

A reinforcement structure is provided for reinforcing a thumbscrew that fastens a printed circuit board (PCB) assembly to a metal carrier. The reinforcement structure may include a cap configured to engage with the thumbscrew. The cap may include a hollow cylindrical body having an outer sidewall and outer gears on the outer sidewall. The reinforcement structure may also include a base configured to attach to the PCB assembly. The base may include a planar plate having two or more outer edges and an inner hole. The base may also include an inner sidewall extending from the inner hole downward perpendicularly from the planar plate. The base may also include internal gears on an upper portion of the inner sidewall. The outer gears of the cap are coupled to the internal gears of the base to transfer the torque from the thumbscrew to the cap and to the base and then to nearby PCB components.

18 Claims, 12 Drawing Sheets

(56)  References Cited

U.S. PATENT DOCUMENTS

| 6,257,813 | B1 * | 7/2001 | Tanimura | ................ | B25B 21/00 |
| | | | | | 411/536 |
| 8,113,754 | B2 * | 2/2012 | Dahl | ....................... | F16B 39/02 |
| | | | | | 411/320 |
| 2007/0151355 | A1 * | 7/2007 | Marczynski | ............ | F16B 39/10 |
| | | | | | 73/761 |
| 2010/0284763 | A1 * | 11/2010 | Busch | ................ | F16B 37/0864 |
| | | | | | 411/109 |
| 2011/0081218 | A1 * | 4/2011 | Wang | ................... | F16B 5/0208 |
| | | | | | 411/120 |
| 2014/0348611 | A1 * | 11/2014 | Davis | ..................... | F16B 39/10 |
| | | | | | 411/214 |
| 2016/0363155 | A1 * | 12/2016 | Hartanto | ................ | F16B 39/04 |
| 2017/0343034 | A1 * | 11/2017 | Zollmann | ............... | F16B 39/04 |
| 2020/0124081 | A1 * | 4/2020 | Bengtsson | ............... | B60K 1/04 |

* cited by examiner

PRINTED CIRCUIT BOARD THUMBSCREW LOCKING REINFORCEMENT STRUCTURE

FIELD

The disclosure is directed to designs and fabrications of reinforcement structures for printed circuit board (PCB) thumbscrews.

BACKGROUND

High-performance computing servers are energy-intensive and densely configured in smaller spaces in a data center. The servers may include printed circuit board (PCB) assemblies, which include electronic components mounted on a PCB. The PCB assembly is attached to a metal carrier by using one or more PCB thumbscrews.

During shock and vibrational testing procedures and/or shipping and transportation of a server, the thumbscrews that hold the PCB assembly onto the sheet metal carrier are prone to spontaneous loosening. The thumbscrews may have a specific torque setting in which the PCB assembly can be fastened onto the sheet metal carrier. However, the specific torque setting may not be enough to keep the thumbscrews from self-loosening due to shock, vibration, or dynamic loads that may result from the shipping and transportation of the server.

Simply increasing the torque setting may not be an option for resolving the issue, because increased torque may either damage the thumbscrew slot, the thumbscrew threads, and/ or the threads of the sheet metal carrier's screw hole.

Conventionally, fastener reinforcement is achieved by using a thread locking fluid. However, the thread locking fluid, such as Loctite, is consumable. When a fastener is unfastened and refastened, the existing thread-locking fluid becomes old or dried, which can be removed by using a sharp edge tool and replaced with a new layer of thread locking fluid, which requires more supply of the thread-locking fluid. The thread locking fluid is not reusable. Also, the sharp edge tool is needed to remove the dried thread-locking fluid. There remains a need for developing a better solution for reinforcement of the PCB thumbscrew.

BRIEF SUMMARY

In one aspect, a reinforcement structure is provided for reinforcing a thumbscrew that fastens a printed circuit board (PCB) assembly to a metal carrier. The reinforcement structure may include a cap configured to engage with the thumbscrew. The cap may include a hollow cylindrical body having an outer sidewall and outer gears on the outer sidewall. The reinforcement structure may also include a base configured to attach to the PCB assembly. The base may include a planar plate having two or more outer edges and an inner hole. The base may also include an inner sidewall extending from the inner hole downward perpendicularly from the planar plate. The base may also include internal gears on an upper portion of the inner sidewall. The outer gears of the cap are coupled to the internal gears of the base to transfer the torque from the thumbscrew to the cap and to the base and then to nearby PCB components.

In another aspect, a reinforcement structure is provided for reinforcing a thumbscrew that fastens a PCB assembly to a metal carrier. The reinforcement structure may include a base, which may include a planar plate having two or more outer edges and an inner hole, an inner sidewall extending from the inner hole downward perpendicularly from the planar plate, internal gears on an upper portion of the inner sidewall, and features along the outer edges configured to attach to structures of the PCB assembly. The reinforcement structure may also include a cap which may include a hollow cylindrical body having an outer sidewall, a plurality of inner teeth extending downward from the bottom of the outer sidewall, the plurality of inner teeth configured to align with outer teeth of the thumbscrew to tighten the thumbscrew, outer gears on the outer sidewall, wherein the outer gears of the cap are aligned to engage with the internal gears of the base to transfer the torque from the thumbscrew to the base through the cap, and a tab engaged with the hollow cylindrical body to slightly rotate the cap to engage the cap with the thumbscrew.

Additional embodiments and features are set forth in part in the description that follows, and will become apparent to those skilled in the art upon examination of the specification or may be learned by the practice of the disclosed subject matter. A further understanding of the nature and advantages of the disclosure may be realized by reference to the remaining portions of the specification and the drawings, which forms a part of this disclosure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

The disclosure may be understood by reference to the following detailed description, taken in conjunction with the drawings as described below. It is noted that, for purposes of illustrative clarity, certain elements in various drawings may not be drawn to scale.

The present technology provides a thumbscrew locking reinforcement structure for the reinforcement of the thumbscrew that locks a PCB assembly to a metal carrier, such as a sheet metal carrier. The thumbscrew locking reinforcement structure is a tangible object rather than the conventional consumable thread-locking fluid. The thumbscrew locking reinforcement structure provides high structural integrity, and high resistance to rotational wear when it is installed on a PCB thumbscrew. Also, the thumbscrew locking reinforcement structure can be easily removed without any tools. Further, the thumbscrew locking reinforcement structure provides a more convenient solution during the serviceability of the PCB assembly if the PCB assembly needs to be unfastened and refastened into its sheet metal carrier.

Figure 1A:
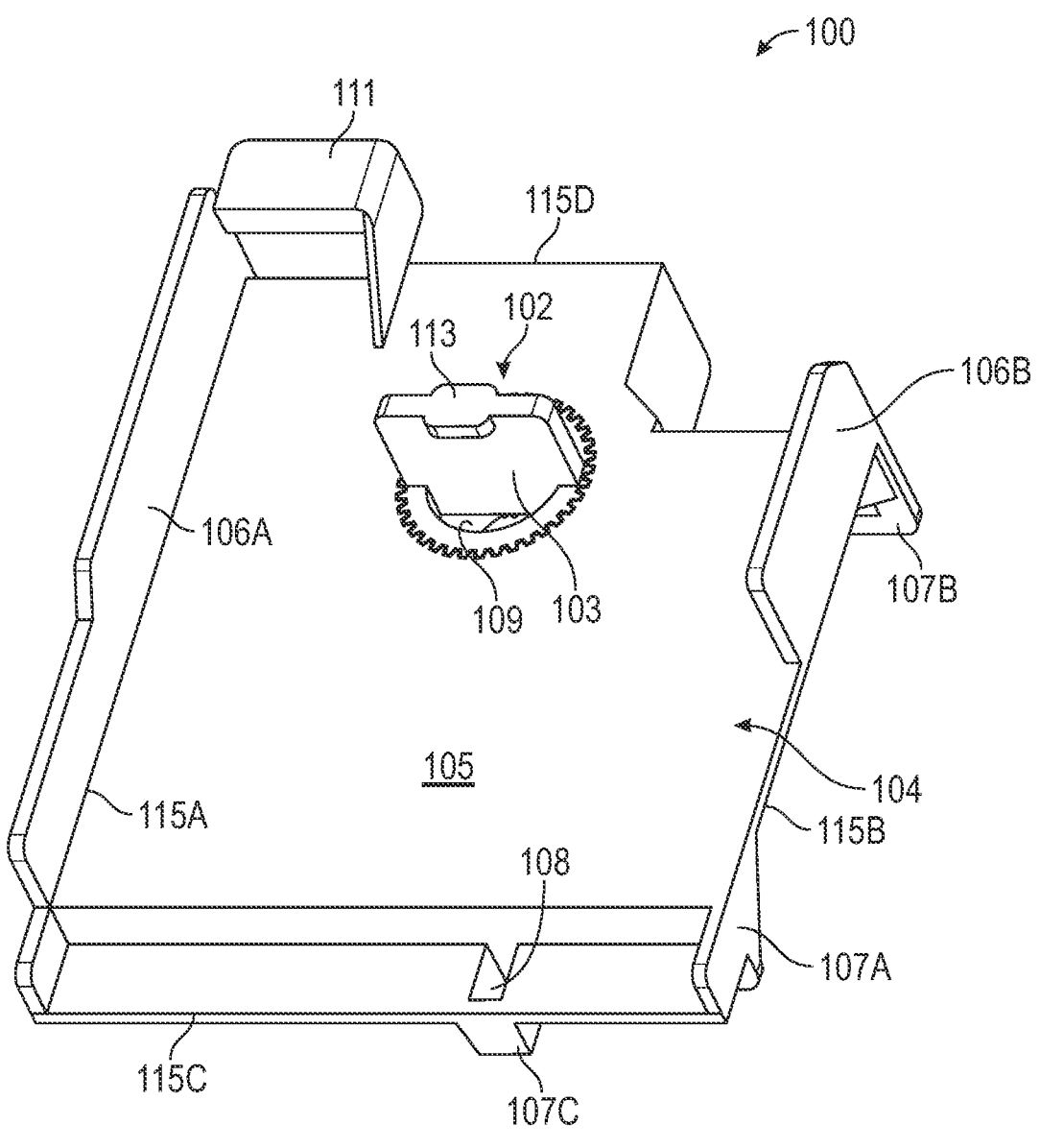
FIG. 1A is a top perspective view of a thumbscrew reinforcement structure for a thumbscrew that fastens a printed circuit board (PCB) or a PCB assembly to a metal carrier in accordance with an embodiment of the disclosure.
Figure 1B:
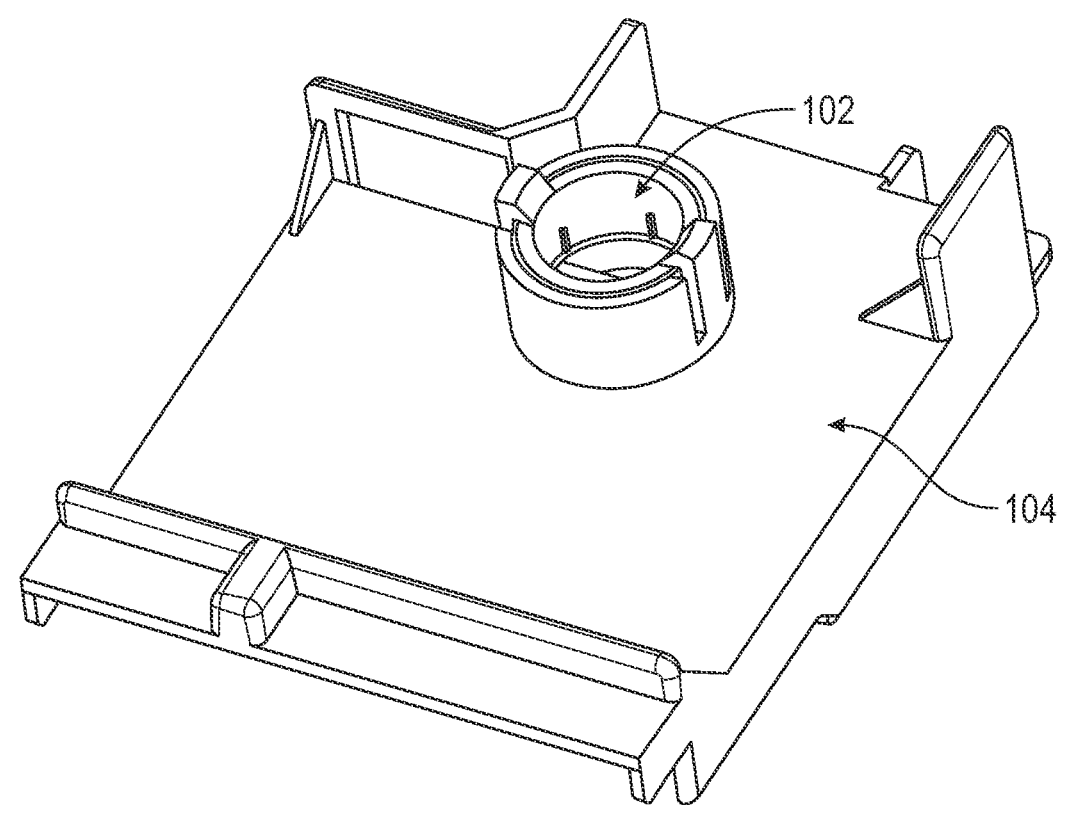
FIG. 1B is a bottom perspective view of the thumbscrew reinforcement structure of FIG. 1A in accordance with an embodiment of the disclosure.

FIG. 1A is a top perspective view of a printed circuit board (PCB) thumbscrew reinforcement structure in accordance with an embodiment of the disclosure. FIG. 1B is a bottom perspective view of the thumbscrew reinforcement structure of FIG. 1A in accordance with an embodiment of the disclosure. FIG. 1B is a bottom perspective view of the thumbscrew reinforcement structure of FIG. 1A in accordance with an embodiment of the disclosure. As illustrated in FIGS. 1A and 1B, a reinforcement structure 100 includes a cap 102 and a base 104. The cap 102 of the reinforcement structure 100 allows the reinforcement structure to align with the PCB thumbscrew at any fastened position. The PCB thumbscrew may not have the same sectional knurling patterns or knurling sections. Also, these knurling sections cannot always be in the same position when the thumbscrew is in its fastened position. The cap 102 includes a tab 103 configured for a user to slightly rotate the cap when lifted or pulled up while the thumbscrew is in its fastened position. The tab 103 is also configured for a user to pull up the cap to disengage the cap with the thumbscrew.

The base is attached to the PCB assembly. The base 104 is coupled to the cap 102 to transfer the torque from the thumbscrew to the base through the cap. The base transfers the force to the PCB assembly. The base 104 includes an inner hole 109 configured to surround the cap 102 and to have its outer edges 115A-D juxtaposed to nearby embedded structures or features of the PCB assembly.

The tab 103 may also include a vertical wall 121 and a ledge 113 extending from the top of the vertical wall 121. The height of the tab 103 is extended so that the top 113 of the tab 103 slightly touches a structure (e.g. airduct or sheet metal base) that sits above the reinforcement structure 100. The tab 103 can restrict the vertical movement of the cap and allows the cap 102 to remain pressed on the top of the PCB thumbscrew.

The cap 102 also features a bottom retaining ledge 304, which helps prevent the cap 102 from being removed completely or detached from the base 104 when a user pulls the tab 103. The bottom retaining ledge 304 prevents the separation of the cap and the base of the reinforcement structure into two pieces.

In some variations, the reinforcement structure 100 is used for reinforcing a thumbscrew that fastens a printed circuit board (PCB) assembly to a metal carrier. The reinforcement structure 100 may include a cap 102 configured to engage with the thumbscrew. The cap 102 may include a hollow cylindrical body having an outer sidewall and outer gears on the outer sidewall. The structure 100 may also include a base 104 configured to attach to the PCB assembly. The base 104 may include a planar plate 105 having two or more outer edges 115A-D and an inner hole 109. The base may also include an inner sidewall extending from the inner hole downward perpendicularly from the planar plate. The base may also include internal gears on an upper portion of the inner sidewall.

In some variations, the base 104 may include a first side flange 106A extending from a first outer edge 115A and a second side flange 106B extending from a second outer edge 115B.

In some variations, the base 104 may include supports 107A-C near the outer edges 115B and 115C.

Figure 2:
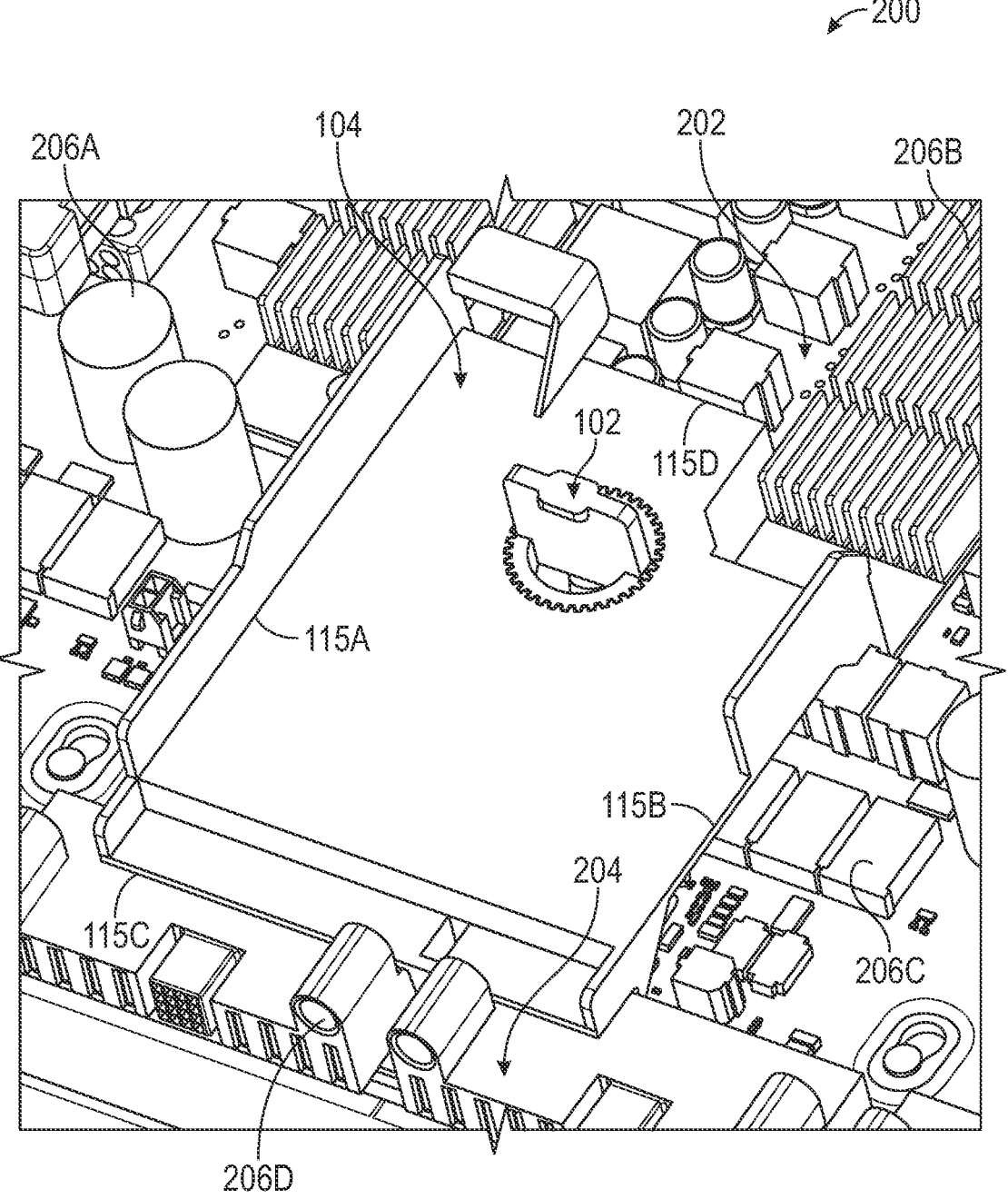
FIG. 2 is a perspective view of the thumbscrew reinforcement structure installed on the thumbscrew in accordance with an embodiment of the disclosure.

FIG. 2 is a top perspective view of the PCB thumbscrew reinforcement structure installed on a PCB thumbscrew in accordance with an embodiment of the disclosure. As illustrated in FIG. 2, a PCB assembly 200 may include components 206A-D and embedded structures 204 mounted on a PCB 202. The PCB assembly also includes the reinforcement structure 100 installed on the PCB 202. The outer edges 115 A-D of the reinforcement structure 100 are surrounded by components 206A-D and embedded structures 204. The outer edge 115C is juxtaposed to the embedded structures 204 or features nearby.

In some variations, the base may include features along the two or more outer edges configured to attach to structures mounted on the PCB assembly.

Figure 3:
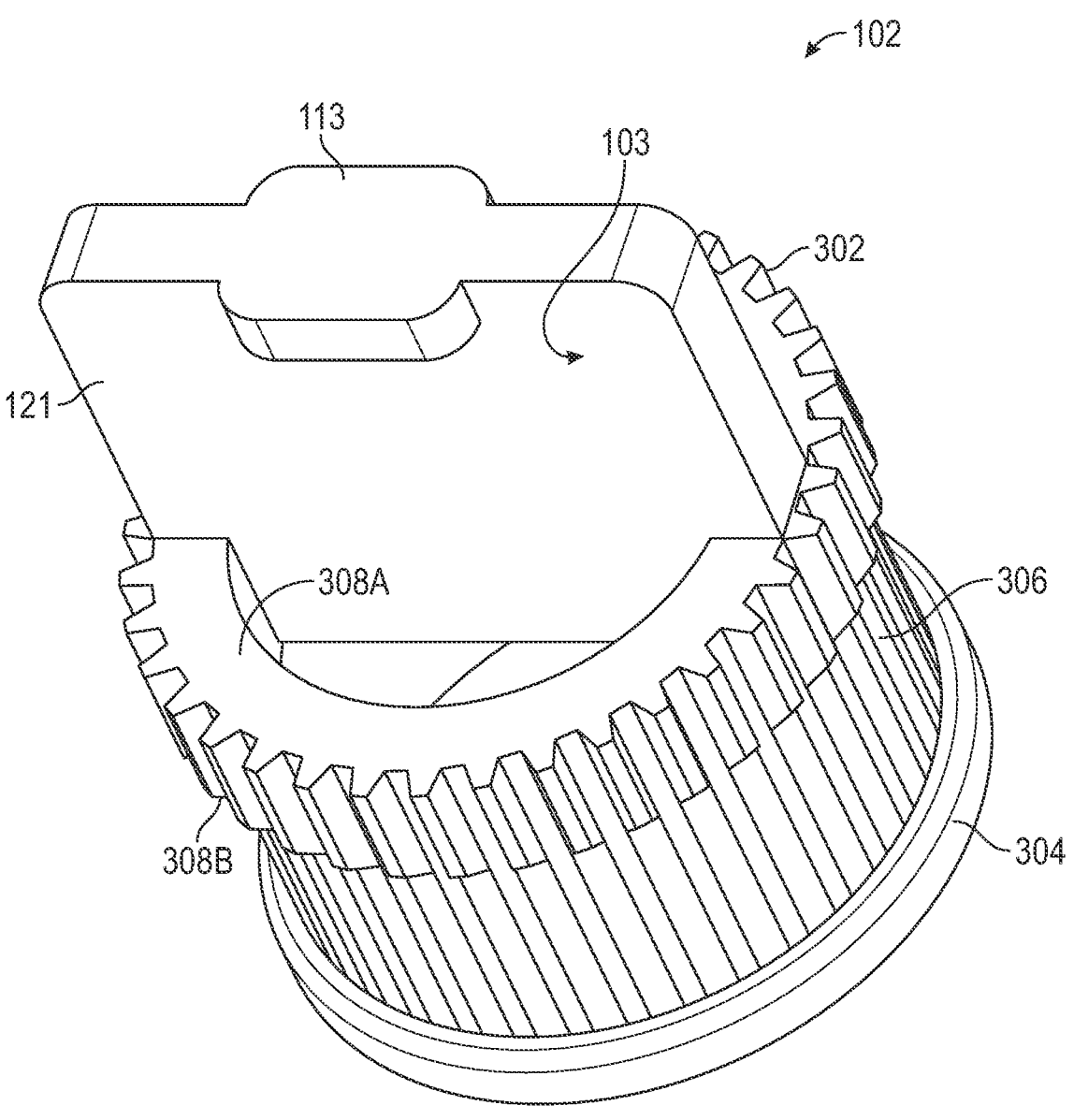
FIG. 3 is a perspective view of a cap of the thumbscrew reinforcement structure of FIG. 1 in accordance with an embodiment of the disclosure.

FIG. 3 is a perspective view of a cap of the PCB thumbscrew reinforcement structure of FIG. 1 in accordance with an embodiment of the disclosure. As illustrated in FIG. 3, the cap 102 includes the tab 103 and a cylindrical body having outer sidewall 306. The cap 102 also includes outer gears 302 on an upper portion of the sidewall 306 between a top surface 308A and a bottom surface 308B.

The cap 102 also includes a retaining ledge 304 at the bottom of the outer sidewall 306. The retaining ledge 304 extends perpendicularly from the bottom of the outer sidewall 306 to protrude outward from the bottom of the outer sidewall 306. The retaining ledge 304 is configured to prevent the cap from being removed from the base. The retaining ledge 304 has a larger diameter than the inner hole of the base 104, such that the cap 102 cannot be pulled out by using the tab 103.

The tab 103 includes the vertical wall 121 which has a lower portion press fitted inside the sidewall 306 of the cap. The tab 103 also includes an upper portion extending on a top surface 308A including outer gears 302.

In some variations, the cap also includes a tab engaged with the hollow cylindrical body to slightly rotate the cap to engage the cap with the thumbscrew.

Figure 4A:
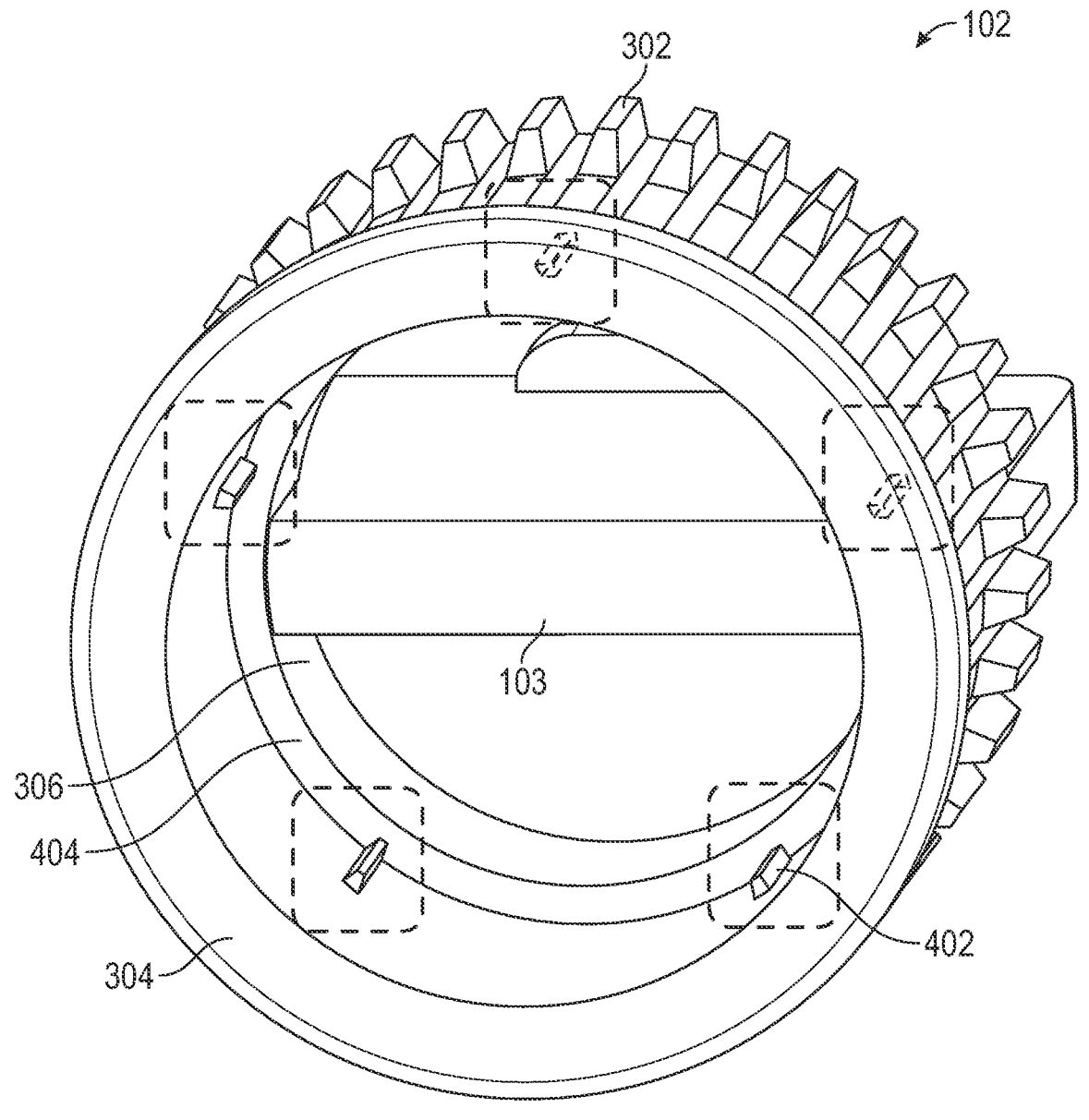
FIG. 4A is a backside perspective view of the cap of FIG. 3 in accordance with an embodiment of the disclosure.
Figure 4B:
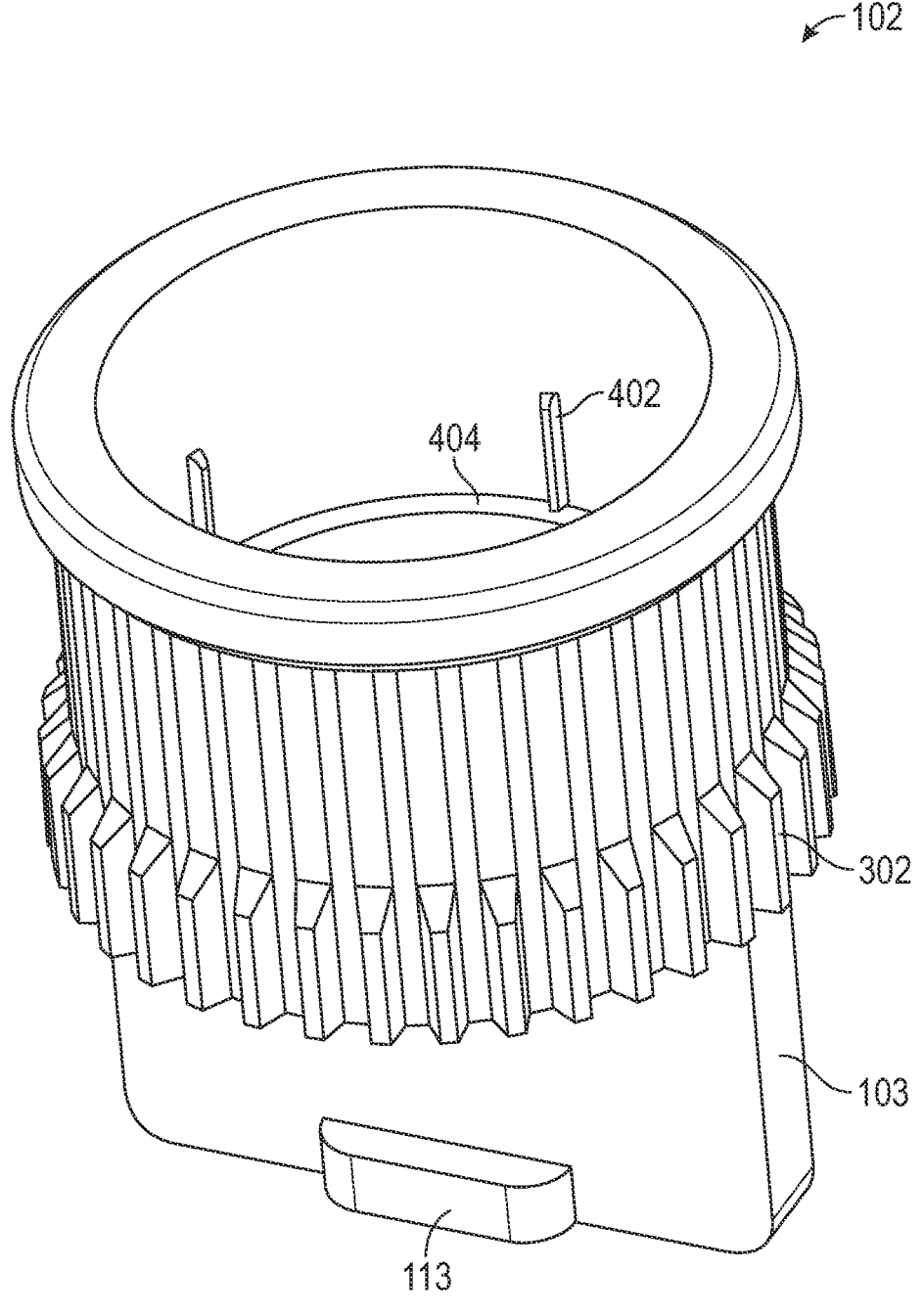
FIG. 4B is a bottom view of the cap of FIG. 4A in accordance with an embodiment of the disclosure.

FIG. 4A is a back perspective view of the cap of FIG. 3 in accordance with an embodiment of the disclosure. FIG. 4B is a bottom view of the cap of FIG. 4A in accordance with an embodiment of the disclosure.

As illustrated, the outer gears 302 of the cap 102 may be aligned with inner teeth 402, which can align with the knurling sections or outer teeth of the PCB thumbscrew. The inner teeth 402 extend from the bottom surface 404 and is perpendicular to the bottom surface 404. Five inner teeth 402 correspond to five knurling sections of the PCB thumbscrew. The tab 103 allows the user to slightly rotate the cap so that its inner teeth 402 can sit inside the knurling sections between outer teeth of the thumbscrew and can be aligned with the knurling sections of the PCB thumbscrew.

In some variations, the cap also includes a plurality of inner teeth extending downward from the bottom of the sidewall. The plurality of inner teeth is configured to align with outer teeth of the thumbscrew to engage with the thumbscrew.

Figures 5, 6:
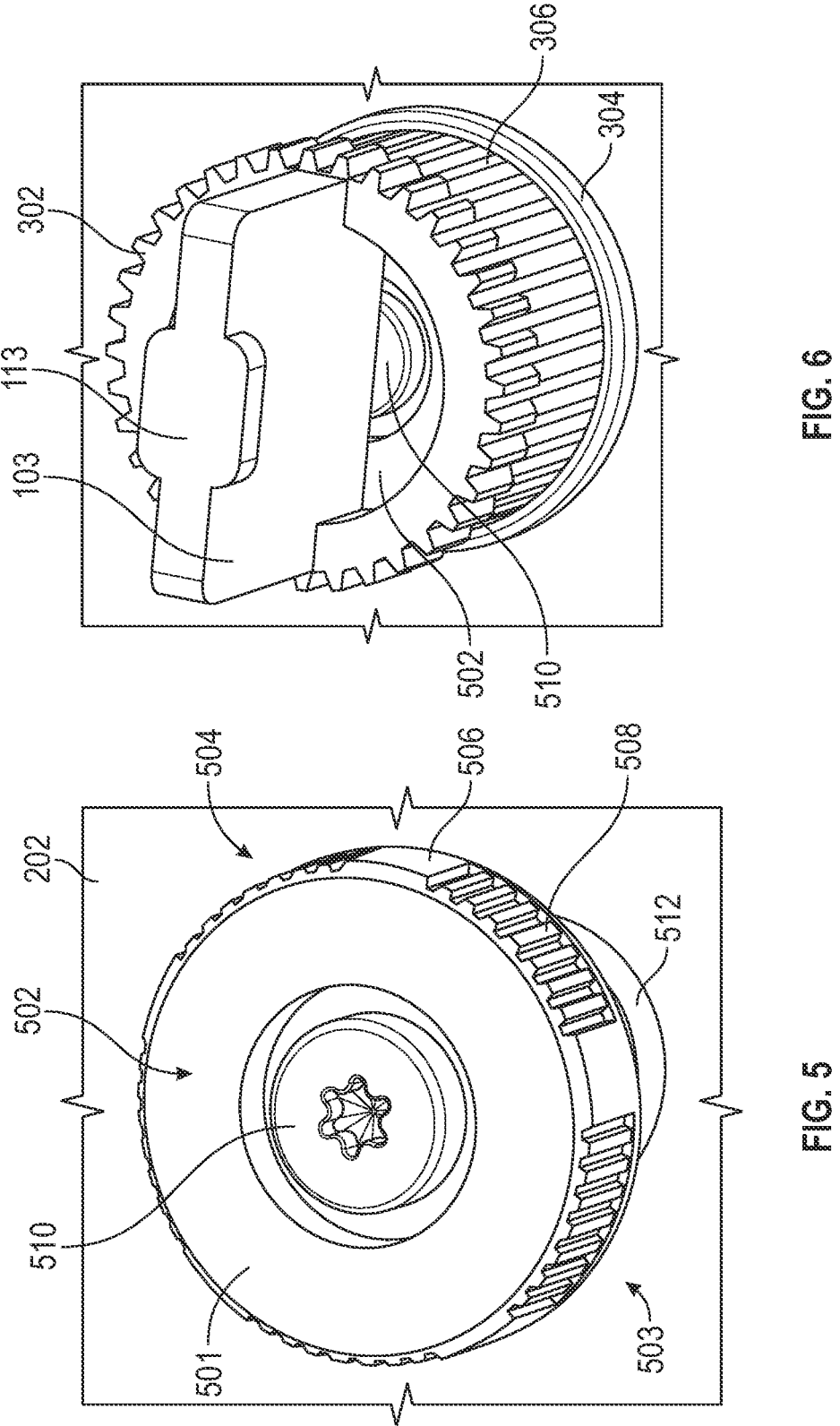
FIG. 5 is a perspective view of a PCB thumbscrew including knurled sections in accordance with an embodiment of the disclosure.
FIG. 6 is a perspective view of the cap of FIG. 3 installed on the PCB thumbscrew of FIG. 5 in accordance with an embodiment of the disclosure.

FIG. 5 is a perspective view of a PCB thumbscrew including knurled sections in accordance with an embodiment of the disclosure. As illustrated, a thumbscrew 502 includes a screw 510 that attaches the PCB 202 to a metal carrier 512, which is under the thumbscrew 502. As shown, thumbscrew 502 also includes a cylindrical outer body including a circular top surface 501 and a bottom surface 503, and a surrounding outer sidewall extending from the edge of the top surface 501 to the edge of the bottom surface 503. The outer sidewall of the thumbscrew 502 includes five knurling sections 504, separated by five flat portions 506. The five knurling sections 504 of the thumbscrew 502 can engage with inner teeth 402 of the cap.

As an example, the knurling sections 504 may include outer teeth 508 that are perpendicular to the top surface 501 and the bottom surface 503. The inner teeth 402 of the cap 102 are configured to fit into the space between two neighboring outer teeth 508.

In some variations, thumbscrews 502 may not have the same sectional knurling patterns or knurling sections 504. Also, these knurling sections cannot always be in the same position when the thumbscrew is in its fastened position.

The thumbscrew locking reinforcement structure 100 is configured to reinforce the torque of the PCB thumbscrew 502 into its sheet metal carrier 512 without any additional torque applied to the thumbscrew 502. Also, the thumbscrew locking reinforcement structure 502 does not need any tools for installation, unlike the tools needed for removing the old thread-locking fluid.

FIG. 6 is a perspective view of the cap of FIG. 3 installed on the PCB thumbscrew of FIG. 5 in accordance with an embodiment of the disclosure. As illustrated, the cylindrical body with outer sidewall 306 of the cap 102 is configured to sit on the top of the knurled thumbscrew 502 (or knurled knob screw). The outer gears 306 or teeth of the cap align with the inner teeth 402, which align with outer teeth 508 of the thumbscrew. The tab 103 is configured for a user to slightly rotate the cap 102 to align its outer gears 306 and inner teeth 402 with the teeth 508 of the thumbscrew while the thumbscrew is in its fastened position.

Figures 7, 8:
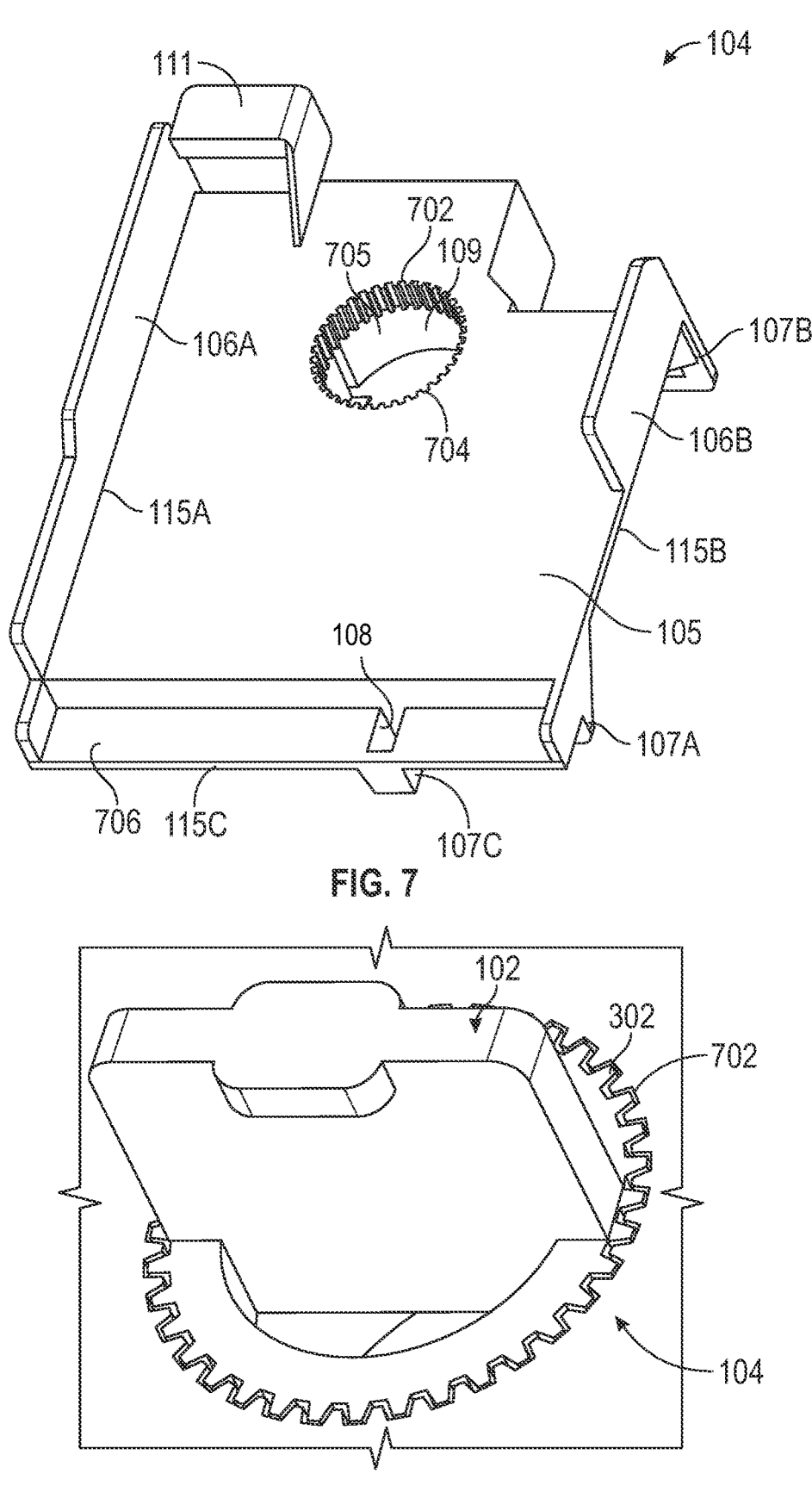
FIG. 7 is a perspective view of a base of the thumbscrew reinforcement structure in accordance with an embodiment of the disclosure.
FIG. 8 is a perspective view of the cap of FIG. 3 assembled with the base of FIG. 7 in accordance with an embodiment of the disclosure.
Figure 9:
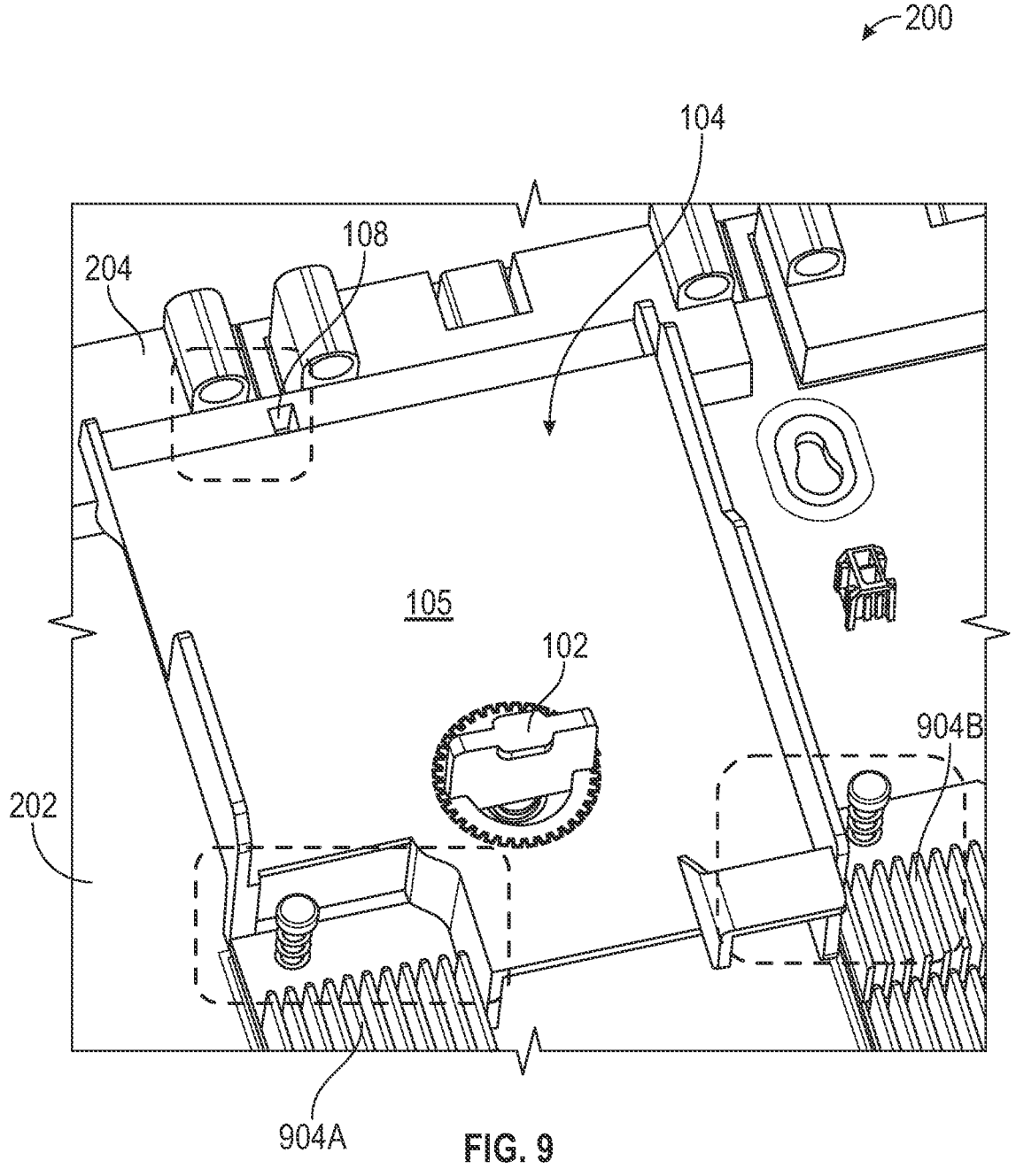
FIG. 9 is a perspective view of the base with outer edges attached to embedded structures of the PCB or PCB assembly in accordance with an embodiment of the disclosure.

FIG. 7 is a perspective view of a base of the PCB thumbscrew reinforcement structure in accordance with an embodiment of the disclosure. As illustrated, the base 104 includes the planar plate 105 having outer edges and the inner hole 109. The base 104 also includes the inner sidewall 705 extending from edge 704 of the inner hole 109 downward perpendicularly from the planar plate 105. The base 104 includes internal gears 702 on an upper portion of the inner sidewall 705. The base 104 also includes features (e.g. slot) 108 along the outer edges 115C configured to attach to structures mounted on the PCB assembly, as illustrated in FIG. 9 and described in related texts.

Also, the base 104 includes a first side flange 106A extending from the first outer edge 115A and a second side flange 106B extending from the second outer edge 115B opposite to the first outer edge. The outer side flanges 106A-B are configured to have an adequate height that slightly touches a structure above, such as an airduct or a sheet metal base, among others. The side flanges 106A-B, like the tab 103 of the cap, help restrict the vertical movement of the base, so that the reinforcement structure 100 stays in place and cannot be pop-out of its desired position.

Also, the base 104 may include supports 107A, 107B, and 107C near the outer edges 115. The supports 107A, 107B, and 107C of the base 104 are configured to fit tightly in relation to feature 204. This design does not need any screws for fastening the reinforcement structure to the PCB. The retaining tabs 1102A and 1102B can prevent the cap 102 from falling through the cylindrical hole 109 of the base, when the reinforcement structure 100 is lifted from the PCB 202. Both retaining tabs 1102A and 1102B can be flexed outward for the user to remove the cap.

FIG. 8 is a perspective view of the cap of FIG. 3 assembled with the base of FIG. 7 in accordance with an embodiment of the disclosure. As illustrated in FIG. 8, the cap 102 is assembled with the base 104. As illustrated, outer gears 302 of the cap 102 align with the internal gears 702 of the base 104, such that the outer gears 302 of the cap are engaged with the internal gears of the base 104. The outer gears 302 on both the outer sidewall of the cap 102 and the internal gears 702 on the inner sidewall of the base 104 serve as the locking mechanism of the reinforcement structure 100, which prevents the thumbscrew 502 from loosening.

In some variations, the outer gears of the cap are aligned to engage with the internal gears of the base to transfer the torque from the thumbscrew to the base through the cap. The base transfers the force to nearby PCB components of the PCB assembly. In other words, the outer gears of the cap are coupled to the internal gears of the base to transfer the torque from the thumbscrew to the cap and to the base and then to nearby PCB components.

FIG. 9 is a top perspective view of the base with outer edges attached to embedded structures of the PCB assembly in accordance with an embodiment of the disclosure. As illustrated in FIG. 9, the base 104 can be fitted tightly to components 904A and 904B mounted on the PCB 202 to prevent horizontal movement. Slot 108 can be fitted tightly to structure 204 mounted on the PCB 202 to prevent the horizontal movement.

When the thumbscrew 502 experiences any rotation or spontaneous loosening, e.g. the rotation is in an anti-clockwise direction, a torque in a clockwise direction can be opposed by the outer gears 302 of the cap 102, which sits between the outer teeth 508 of the thumbscrew 502. The cap 102 is being kept from rotating with the thumbscrew 502 by its outer gears 302 aligning with the internal gears 702 of the base. The base 104 is prevented from rotation by its outer edges 115A-D conflicting with the nearby PCB features 904A or 904B or structures 204. As such, the thumbscrew locking reinforcement structure 100 transfers the torque from the threads 508 of the thumbscrew 502 to the embedded structures 204 and PCB features 904A-B on the PCB assembly 200.

Figure 10:
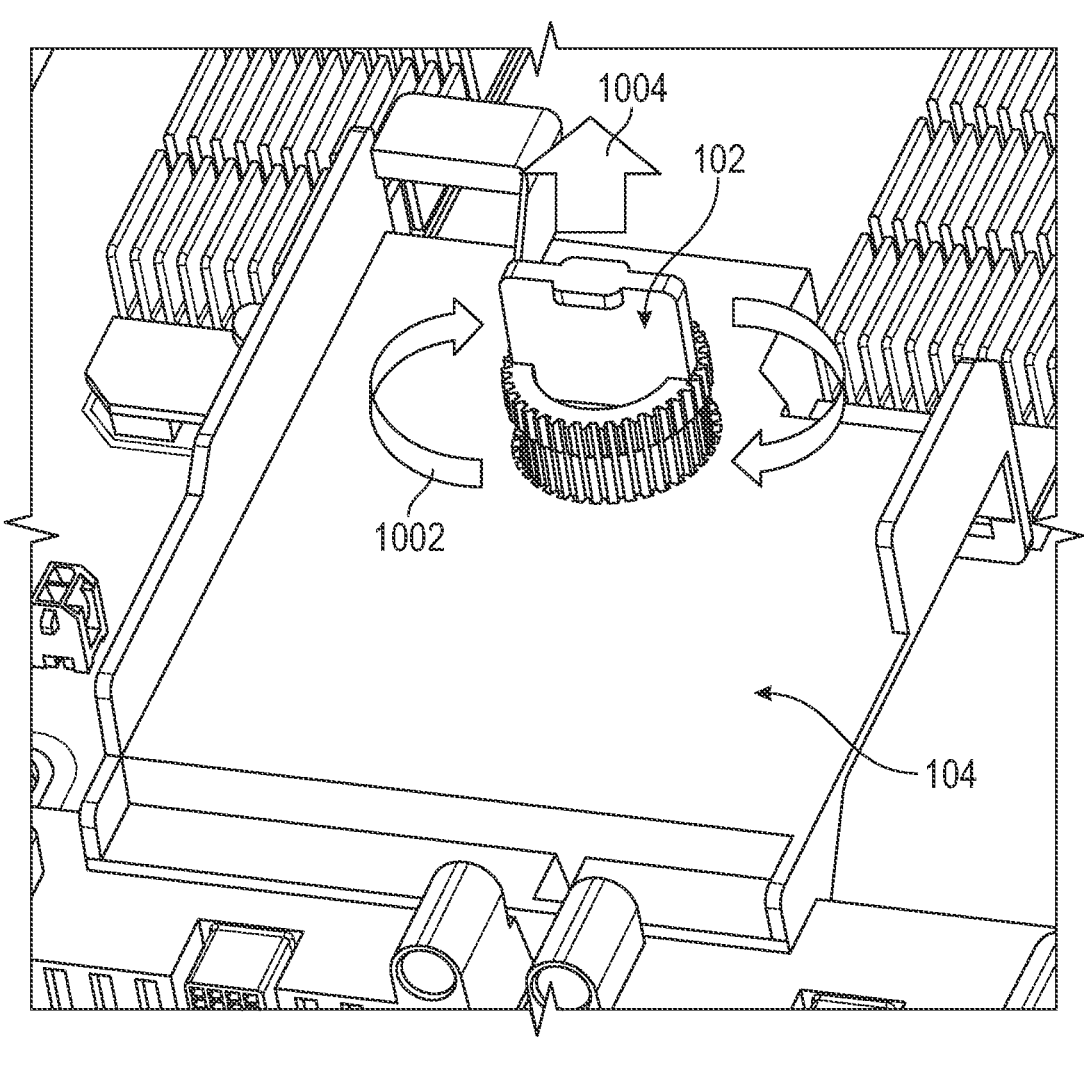
FIG. 10 is a perspective view of the reinforcement structure that can be slightly rotated or pulled up or pushed down in operations in accordance with an embodiment of the disclosure.

FIG. 10 is a perspective view of the reinforcement structure that can be slightly rotated or pulled up in operations in accordance with an embodiment of the disclosure. As illustrated in FIG. 10, the cap 102 can be pulled up as illustrated by arrow 1004. When the cap 102 is pulled up, the cap 102 is not engaged with the thumbscrew 502. When the cap 102 is pushed down, the inner teeth 402 are engaged with the outer teeth 508 of the thumbscrew 502. The PCB thumbscrew 502 can be reinforced by the reinforcement structure including the cap 102 and the base 104. When rotating the cap 102, the inner teeth 402 of the cap 102 can find good placement inside the outer teeth, knurls, or notches 508 on the outer wall of the thumbscrew 502.

Figure 11:
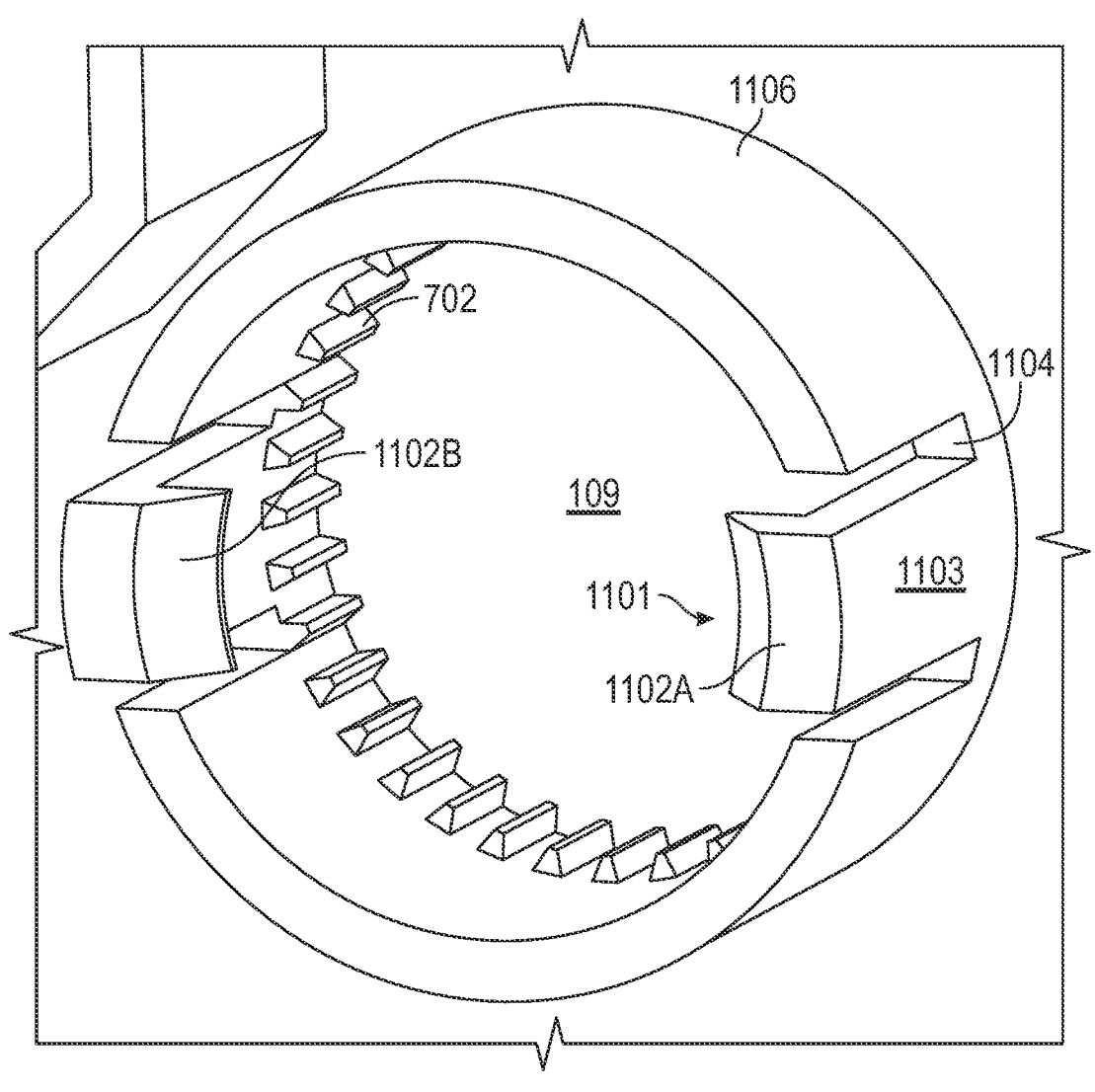
FIG. 11 is a perspective view of the base with retaining tabs in accordance with an embodiment of the disclosure.

FIG. 11 is a side perspective view of the base with retaining tabs in accordance with an embodiment of the disclosure. As illustrated in FIG. 11, two retaining tabs 1101 are placed to be opposite to each other at the bottom of the base 102 near the hole 109 which has an inner wall 1106. An upper portion of the inner wall 1106 includes the internal gears 702, while a bottom portion of the inner wall 1106 includes the two retaining tabs. Each of the retaining tabs 1101 has a flexible side portion 1103 which is partially separated from the sidewall 1106 by slots 1104. The slots 1104 are configured for the side portion 1103 to be flexible. The depths of the slots 1104 may vary, depending upon the material or dimensions of the retaining tabs. Each retaining tab 1101 also includes a lip 1102A or 1102B extending inward perpendicularly from a bottom of the side portion 1103. The lips 1102A and 1102B of the retaining tabs 1101 may retain the cap 102. The lips 1102A and 1102B may also be angled downward to make initial installation of the cap easier. For example, the angled lips 1102A and 1102B help the cap 102 slide in as the retaining tabs 1101 flex outward.

The two retaining tabs 1102A and 1102B can prevent the cap 102 from falling through the cylindrical hole 109 of the base, when the reinforcement structure 100 is lifted from the PCB 202. Both retaining tabs 1102A and 1102B can be flexed outward for the user to remove the cap 102.

In some variations, the base may include first and second retaining tabs on a lower portion of the inner sidewall. The first retaining tab is placed opposite the second retaining tab. Each of the first retaining tab and the second retaining tab may include a flexible side portion and a lip extending from the flexible side portion toward the center of the inner hole of the base.

In some variations, the lips of the first retaining tab and the second retaining tab may be configured to prevent the cap from falling through the inner hole of the base.

In some variations, each of the first retaining tab and second retaining tab may be configured to flex the respective flexible side portion outward to allow a user to remove the cap.

Figure 12:
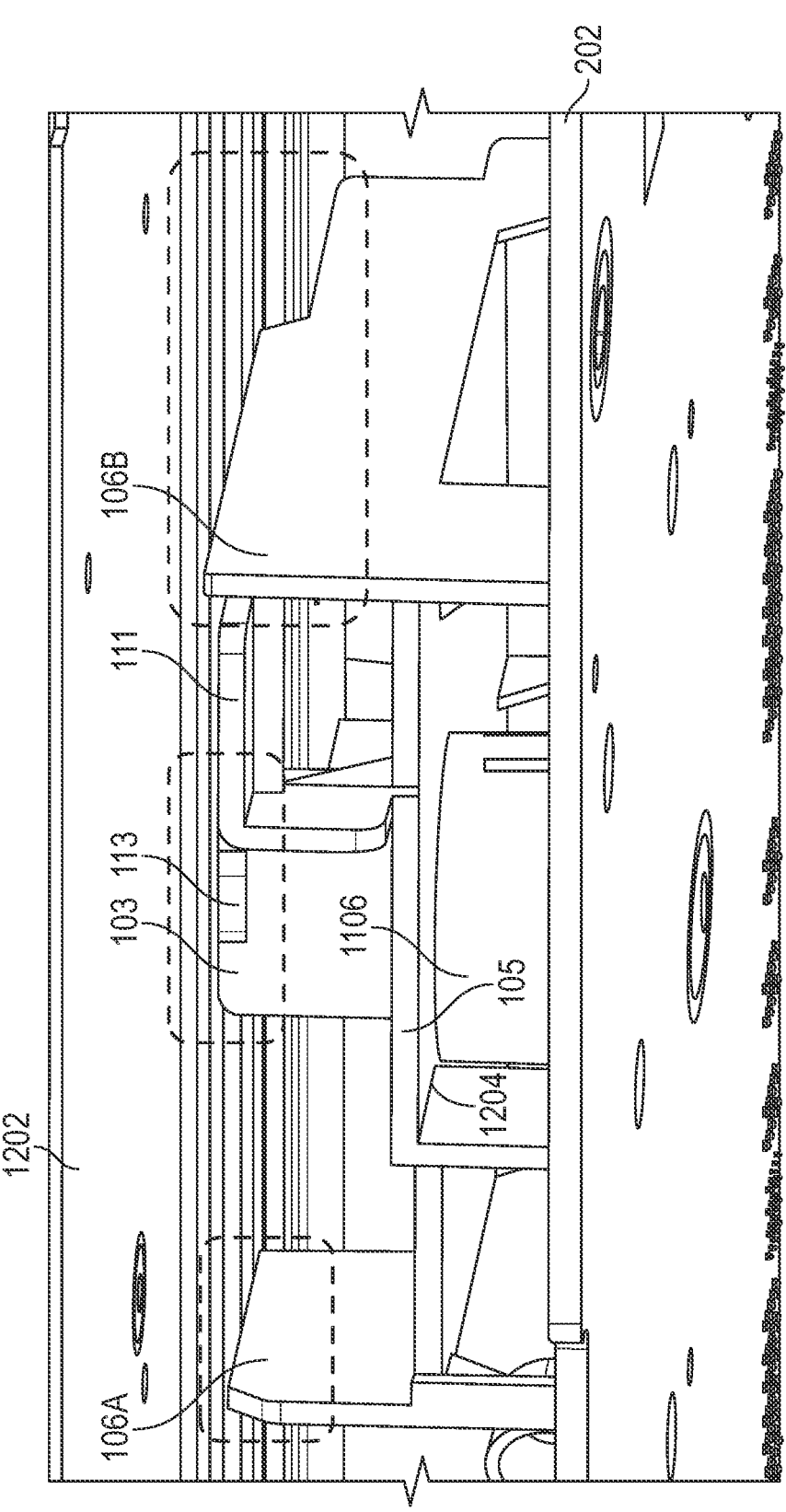
FIG. 12 is a side perspective view of the reinforcement structure installed on a PCB assembly in accordance with an embodiment of the disclosure.

FIG. 12 is a side perspective view of the reinforcement structure installed on a PCB in accordance with an embodiment of the disclosure. As illustrated the reinforcement structure is installed on the PCB 202. The sidewall 1106 of the reinforcement structure is the same height as the edge 1202.

The two outer side flanges 106A-B of the base 104 have an adequate height that slightly touches a structure 1202 above. Also, the structure 111 of the base 104 has an adequate height that slightly touches the structure 1202 above, e.g. an airduct or a sheet metal base. The two outer side flanges 106A-B, structure 111, and the tab 103 of the cap 102 help restrict the vertical movement of the reinforcement structure 100 so that the reinforcement structure 100 is retained in place and cannot move out vertically from its desired position. The sidewall 1106 has the same height as an inner bottom edge 1204 between PCB 202 and the planar plate 105.

EXAMPLES

The following examples are for illustration purposes only. It will be apparent to those skilled in the art that many modifications, both to materials and methods, may be practiced without departing from the scope of the disclosure.

In some variations, the base may be formed of a plastic material.

In some variations, the cap may be formed of a metal, such as aluminum.

In some variations, the reinforcement structure may include a plastic base and an aluminum cap.

In some variations, the plastic base may be formed of a plastic material by injection molding.

In some variations, the cap may be fabricated by die casting or computer numerical control (CNC) machining. The reinforcement structure is cost-effective, easy for manufacturability in large quantities.

A prototype of the reinforcement structure was made with a plastic base and an aluminum cap. A thumbscrew may be fastened by a torque of 1.2 newton-meters (Nm). The thumbscrew may need at least a torque of 1.2 Nm to be loosened or unfastened. With the reinforcement structure formed of the plastic base and the aluminum cap, it was tested that the thumbscrew could remain fastened even when the screw 510 of thumbscrew 502 was loosened with a screwdriver set to a torque of 2.7 Nm, which was more than double the torque required to initially fasten the thumbscrew.

Any ranges cited herein are inclusive. The terms "substantially" and "about" used throughout this Specification are used to describe and account for small fluctuations. For example, they can refer to less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%.

Having described several embodiments, it will be recognized by those skilled in the art that various modifications, alternative constructions, and equivalents may be used without departing from the spirit of the invention. Additionally, a number of well-known processes and elements have not been described in order to avoid unnecessarily obscuring the invention. Accordingly, the above description should not be taken as limiting the scope of the invention.

Those skilled in the art will appreciate that the presently disclosed embodiments teach by way of example and not by limitation. Therefore, the matter contained in the above description or shown in the accompanying drawings should be interpreted as illustrative and not in a limiting sense. The following claims are intended to cover all generic and specific features described herein, as well as all statements of the scope of the method and system, which, as a matter of language, might be said to fall therebetween.

What is claimed is:

1. A reinforcement structure for reinforcing a thumbscrew that fastens a printed circuit board (PCB) assembly to a metal carrier, the reinforcement structure comprising:

a cap configured to engage with the thumbscrew, the cap comprising:

a hollow cylindrical body having an outer sidewall; and outer gears disposed on the outer sidewall; and a base configured to attach to the PCB assembly, the base comprising:

a planar plate having two or more outer edges and an inner hole;

an inner sidewall extending from the inner hole downward perpendicularly from the planar plate;

first and second retaining tabs on a lower portion of the inner sidewall, wherein the first and second retaining tabs are opposite each other; and internal gears on an upper portion of the inner sidewall, wherein the outer gears of the cap are coupled to the internal gears of the base to transfer torque from the thumbscrew to the cap and to the base and then to structures mounted on the PCB assembly.

2. The reinforcement structure of claim 1, wherein the cap further comprises:

a plurality of inner teeth extending downward from the bottom of the sidewall, the plurality of inner teeth configured to align with outer teeth of the thumbscrew to engage with the thumbscrew; and a tab engaged with the hollow cylindrical body to slightly rotate the cap to engage the cap with the thumbscrew, wherein the outer gears of the cap are aligned to engage with the internal gears of the base.

3. The reinforcement structure of claim 2, wherein the cap comprises a retaining ledge surrounding the bottom of the outer sidewall and extending perpendicularly from the bottom of the outer sidewall to protrude outward from the bottom of the outer sidewall, the retaining ledge configured to prevent the cap from being removed from the base.

4. The reinforcement structure of claim 1, wherein each of the first retaining tab and the second retaining tab comprises a flexible side portion and a lip extending from the flexible side portion toward the center of the inner hole of the base.

5. The reinforcement structure of claim 4, wherein the lips of the first retaining tab and the second retaining tab are configured to prevent the cap from falling through the inner hole of the base.

6. The reinforcement structure of claim 4, wherein each of the first retaining tab and the second retaining tab is configured to flex the respective flexible side portion outward to allow a user to remove the cap.

7. The reinforcement structure of claim 1, wherein the base comprises a first side flange extending from a first outer edge and a second side flange extending from a second outer edge.

8. The reinforcement structure of claim 1, wherein the base comprises supports near the two or more outer edges.

9. The reinforcement structure of claim 1, wherein the base comprises features disposed along the two or more outer edges configured to attach to structures mounted on the PCB assembly.

10. A reinforcement structure for reinforcing a thumbscrew that fastens a PCB assembly to a metal carrier, the reinforcement structure comprising:

a base comprising:

a planar plate having two or more outer edges and an inner hole;

an inner sidewall extending from the inner hole downward perpendicularly from the planar plate;

internal gears on an upper portion of the inner sidewall;

features along the two or more outer edges configured to abut against structures of the PCB assembly;

a first side flange extending from a first outer edge of the two or more outer edges and a second side flange extending from a second outer edge of the two or more outer edges; and a cap comprising:

a hollow cylindrical body having an outer sidewall;

a plurality of inner teeth extending downward from the bottom of the outer sidewall, the plurality of inner teeth configured to align with outer teeth of the thumbscrew to tighten the thumbscrew;

outer gears on the outer sidewall, wherein the outer gears of the cap are aligned to engage with the internal gears of the base to transfer a torque from the thumbscrew to the base through the cap and then to the structures mounted on the PCB assembly; and a tab engaged with the hollow cylindrical body to slightly rotate the cap to engage the cap with the thumbscrew.

11. The reinforcement structure of claim 10, wherein the base comprises first and second retaining tabs on a lower portion of the inner sidewall, wherein the first retaining tab is placed opposite to the second retaining tab.

12. The reinforcement structure of claim 11, wherein each of the first retaining tab and the second retaining tab comprises a flexible side portion and a lip extending from the flexible side portion toward the center of the inner hole of the base.

13. The reinforcement structure of claim 12, wherein the lips of the first retaining tab and the second retaining tab are configured to prevent the cap from falling through the inner hole of the base.

14. The reinforcement structure of claim 12, wherein each of the first retaining tab and the second retaining tab is configured to flex the respective flexible side portion outward to allow a user to remove the cap.

15. The reinforcement structure of claim 10, wherein the base comprises supports near the two or more outer edges.

16. The reinforcement structure of claim 10, wherein the cap comprises a retaining ledge surrounding the bottom of the outer sidewall and extending perpendicularly from the bottom of the outer sidewall to protrude outward from the bottom of the outer sidewall, the retaining ledge configured to prevent the cap from being removed from the base.

17. The reinforcement structure of claim 10, wherein the cap comprises aluminum.

18. The reinforcement structure of claim 10, wherein the base comprises a plastic material.

* * * * *